United States Patent
Fujikawa et al.

(10) Patent No.: US 10,741,465 B2
(45) Date of Patent: Aug. 11, 2020

(54) CIRCUIT MODULE AND METHOD OF MANUFACTURING THE SAME

(71) Applicant: Murata Manufacturing Co., Ltd., Kyoto (JP)

(72) Inventors: Katsuhiko Fujikawa, Kyoto (JP); Shingo Funakawa, Kyoto (JP); Kazushige Sato, Kyoto (JP); Nobumitsu Amachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/451,825

(22) Filed: Jun. 25, 2019

(65) Prior Publication Data

US 2019/0318974 A1 Oct. 17, 2019

Related U.S. Application Data

(63) Continuation of application No. PCT/JP2017/042211, filed on Nov. 24, 2017.

(30) Foreign Application Priority Data

Dec. 27, 2016 (JP) .................. 2016-253805

(51) Int. Cl.
*H01L 23/31* (2006.01)
*H01L 23/29* (2006.01)
(Continued)

(52) U.S. Cl.
CPC .............. *H01L 23/31* (2013.01); *H01L 23/29* (2013.01); *H01L 23/36* (2013.01);
(Continued)

(58) Field of Classification Search
CPC ............. H01L 23/3736; H01L 23/4334; H01L 23/49568; H01L 23/552; H01L 23/49822;
(Continued)

(56) References Cited

U.S. PATENT DOCUMENTS 6,580,167 B1 * 6/2003 Glenn ................. H01L 23/3128
257/706
2011/0248389 A1 10/2011 Yorita et al.

FOREIGN PATENT DOCUMENTS

JP 2002-026656 A 1/2002
JP 2011-198866 A 10/2011
(Continued)

OTHER PUBLICATIONS

International Search Report for International Application No. PCT/JP2017/042211 dated Feb. 6, 2018.
(Continued)

*Primary Examiner* — Selim U Ahmed
*Assistant Examiner* — Evan G Clinton
(74) *Attorney, Agent, or Firm* — Pearne & Gordon LLP

(57) ABSTRACT

A circuit module (301) includes a first substrate (201), a first module (101), a sealing resin portion (3), and a conductive material film (7). The first substrate (201) has a first principal surface (201*a*). The first module (101) is mounted on the first principal surface (201*a*). The sealing resin portion (3) is formed on the first principal surface (201*a*) and covers the first module (101). The conductive material film (7) covers a side of the sealing resin portion (3). The first module (101) includes a conductive material portion and a device which may produce heat and which is mounted on the conductive material portion. The conductive material portion connects with the conductive material film (7) on the side of the sealing resin portion (3).

7 Claims, 17 Drawing Sheets

(51) Int. Cl.
  *H01L 23/36*    (2006.01)
  *H01L 23/495*   (2006.01)
  *H01L 25/065*   (2006.01)
  *H05K 3/36*     (2006.01)
  *H01L 23/373*   (2006.01)
  *H01L 23/433*   (2006.01)

(52) U.S. Cl.
  CPC ...... *H01L 23/3736* (2013.01); *H01L 23/4334* (2013.01); *H01L 23/495* (2013.01); *H01L 23/49568* (2013.01); *H01L 25/0652* (2013.01); *H05K 3/36* (2013.01); *H05K 2201/10378* (2013.01); *H05K 2201/10621* (2013.01); *H05K 2201/2018* (2013.01)

(58) Field of Classification Search
  CPC .. H01L 23/4985; H01L 23/49861; H05K 3/36
  See application file for complete search history.

(56) References Cited

FOREIGN PATENT DOCUMENTS

| JP | 2011-211023 A | 10/2011 |
| JP | 2012-049419 A | 3/2012 |

OTHER PUBLICATIONS

Written Opinion for International Application No. PCT/JP2017/042211 dated Feb. 6, 2018.
Notice of the First Office Action for Chinese Patent Application No. 201780080719.2, dated Mar. 3, 2020.

\* cited by examiner

CIRCUIT MODULE AND METHOD OF MANUFACTURING THE SAME

This is a continuation of International Application No. PCT/JP2017/042211 filed on Nov. 24, 2017 which claims priority from Japanese Patent Application No. 2016-253805 filed on Dec. 27, 2016. The contents of these applications are incorporated herein by reference in their entireties.

BACKGROUND OF THE DISCLOSURE

Field of the Disclosure

The present disclosure relates to a circuit module and a method of manufacturing the circuit module.

Description of the Related Art

Communication modules are used, for example, in a wireless LAN (Local Area Network) and LTE (Long Term Evolution). In order to reduce the sizes of these communication modules and increase their performance, FEMs (Front End Modules), which are frontend units for communication and which each include, in a single package, for example, a low-noise amplifier (hereinafter also referred to as an "LNA"), a power amplifier (hereinafter also referred to as a "PA"), and a high frequency switch (hereinafter also referred to as an "SW"), have been mounted in the communication modules.

Many FEMs are manufactured by using a semiconductor packaging technique. Specifically, a bare chip IC which is bonded, for example, on a lead frame or an interposer is enclosed in a package by using transfer molding. An FEM thus manufactured is mounted on the substrate of a communication module, and is embedded by using a resin. Then, the outer faces are subjected to shielding. Thus, the communication module is obtained.

An exemplary technique of the related art is described in Japanese Unexamined Patent Application Publication No. 2002-26656 (Patent Document 1).

Patent Document 1: Japanese Unexamined Patent Application Publication No. 2002-26656

BRIEF SUMMARY OF THE DISCLOSURE

Devices such as a PA included in FEMs may produce heat when the devices operate. The heat produced from these devices may damage the characteristics and reliability of the devices themselves producing the heat, and may also exert adverse effects on the operating states of other electronic components having low heat resistance. Accordingly, there has arisen an issue of finding an efficient way to dissipate the heat produced from the devices. A known solution for the issue is to provide a structure in which a pattern is formed through three-dimensional metallization on a base to dissipate the heat. However, this solution has a problem in terms of the reduction in size and the cost.

Accordingly, an object of the present disclosure is to provide a circuit module which enables the efficient dissipation of the heat produced from an embedded device which may produce the heat.

To attain the above-described object, a circuit module based on an aspect of the present disclosure includes a first substrate, a first module, a sealing resin portion, and a conductive material film. The first substrate has a first principal surface. The first module is mounted on the first principal surface. The sealing resin portion is formed on the first principal surface and covers the first module. The conductive material film covers a side of the sealing resin portion. The first module includes a conductive material portion and a device which is capable of producing heat and which is mounted on the conductive material portion. The conductive material portion is connected to the conductive material film on the side of the sealing resin portion.

The present disclosure enables efficient dissipation of the heat produced from an embedded device which may produce heat.

DETAILED DESCRIPTION OF THE DISCLOSURE

Figure 1:
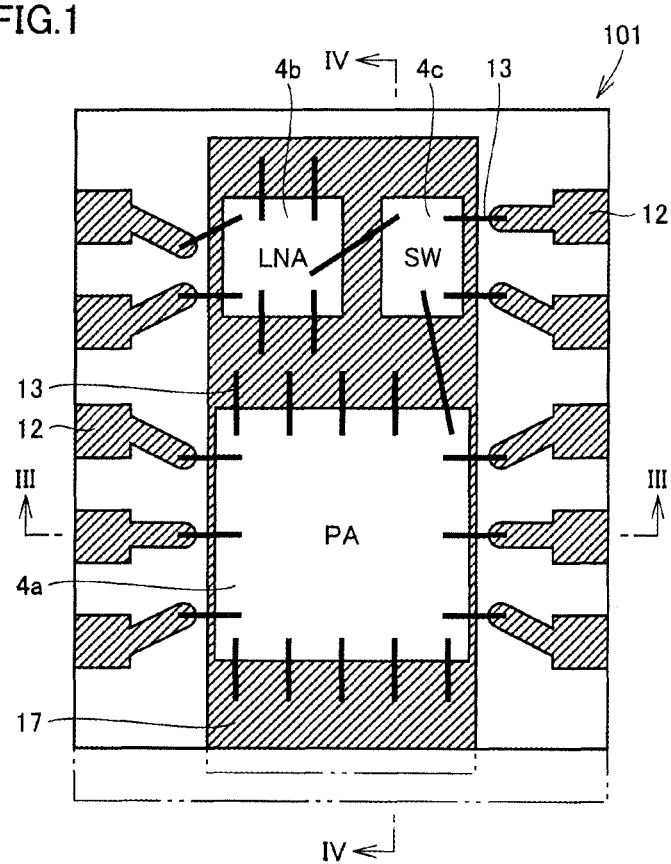
FIG. 1 is a perspective plan view of a first module included in a circuit module according to a first embodiment based on the present disclosure.

The dimensional ratio used in the drawings does not necessarily indicate the true actual ratio, and may indicate an exaggerated dimensional ratio for convenience sake of description. In the description below, in referring to the concept of an upper or lower position, it does not necessarily mean an absolute upper or lower position, and may mean a relative upper or lower position relative to an illustrated orientation.

First Embodiment

Referring to FIGS. 1 to 7, a circuit module according to a first embodiment based on the present disclosure will be described. Before a description about the entire circuit module according to the present embodiment, a first module 101 included in the circuit module will be described. FIG. 1 illustrates a perspective plan view of the first module 101. The first module 101 is, for example, a type of FEM. Components and the like included in the first module 101 are covered by a sealing resin portion. For convenience sake of description, FIG. 1 illustrates the internal structure by seeing through the sealing resin portion. A conductor pattern 17 is disposed in the center. A component 4a, a component 4b, and a component 4c are disposed on the surface of the conductor pattern 17. The component 4a may be, for example, a PA. The component 4b may be, for example, an LNA. The component 4c may be, for example, an SW. Multiple conductor patterns 12 are disposed along the outer sides.

Figure 2:
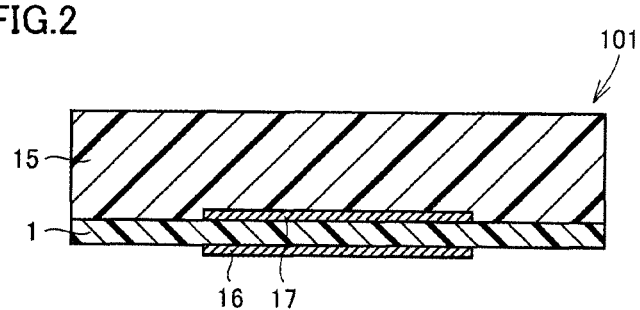
FIG. 2 is a side view of a first module included in a circuit module according to the first embodiment based on the present disclosure.
Figure 3:
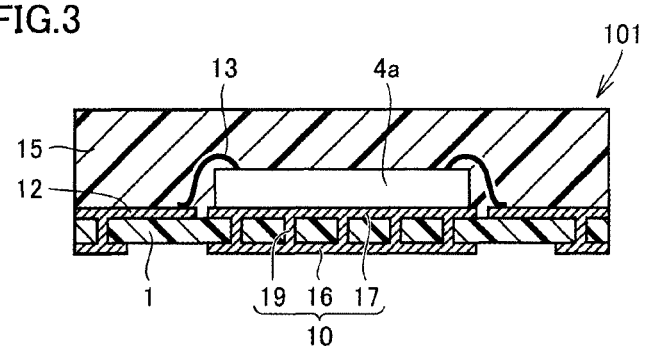
FIG. 3 is a section view along line III-III in FIG. 1.
Figure 4:
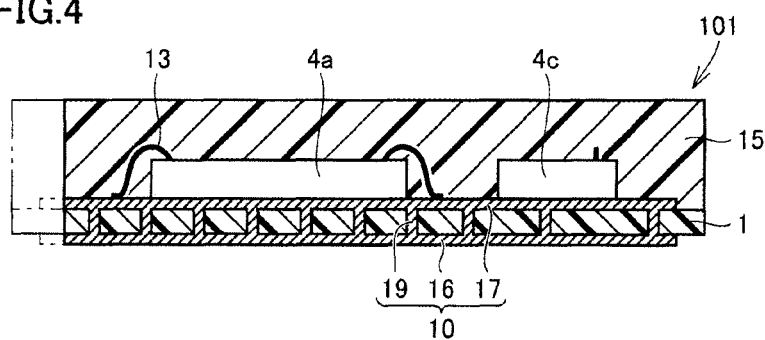
FIG. 4 is a section view along line IV-IV in FIG. 1.

FIG. 2 illustrates a side view of the first module 101. In FIG. 2, an insulated substrate 1 and a sealing resin portion 15 are shown. FIG. 3 is a section view along line III-III in FIG. 1. FIG. 4 illustrates a section view along line IV-IV in FIG. 1. As illustrated in FIGS. 3 and 4, the first module 101 includes the insulated substrate 1 and the sealing resin portion 15. A conductor pattern 16 is formed in a portion of the lower surface of the insulated substrate 1. The conductor pattern 17 is formed in a portion of the top surface. The conductor pattern 16 may be a pattern formed of metallic foil. The metallic foil described herein may be copper foil. For example, the conductor pattern 16 may be formed by etching copper foil, which has been formed in advance on the surface of the insulated substrate 1, into a desired pattern. The same is true for the conductor pattern 17. The conductor pattern 16 is connected to the conductor pattern 17 via conductor vias 19 penetrating the insulated substrate 1 in the thickness direction. A conductive material portion 10 includes the conductor pattern 16, the conductor pattern 17, and the conductor vias 19. The conductive material portion 10 is formed typically of metal. In the case where the conductive material portion 10 is formed of metal, the conductive material portion may be rephrased as a "metal portion". The conductor patterns 12 are formed as terminals in a portion of the top surface of the insulated substrate 1. Electrical connections are made by using wires 13 between the terminals provided on the top surface of the component 4a and conductor patterns 12. In FIGS. 1 and 4, a portion of the end is illustrated by using the chain double-dashed lines. This portion is present in the first stage in which the first module 101 is manufactured by itself, but, after that, is removed when the first module 101 is mounted on some substrate and is finally formed as a circuit module. At the time point at which the first module 101 is finally formed as a circuit module, the portion illustrated by using the chain double-dashed lines in FIGS. 1 and 4 has been already removed. That is, the portion illustrated by using the solid lines in FIGS. 1 and 4 indicates the first module 101 which is present in a circuit module at the time point at which the first module 101 is formed as the circuit module.

Figure 5:
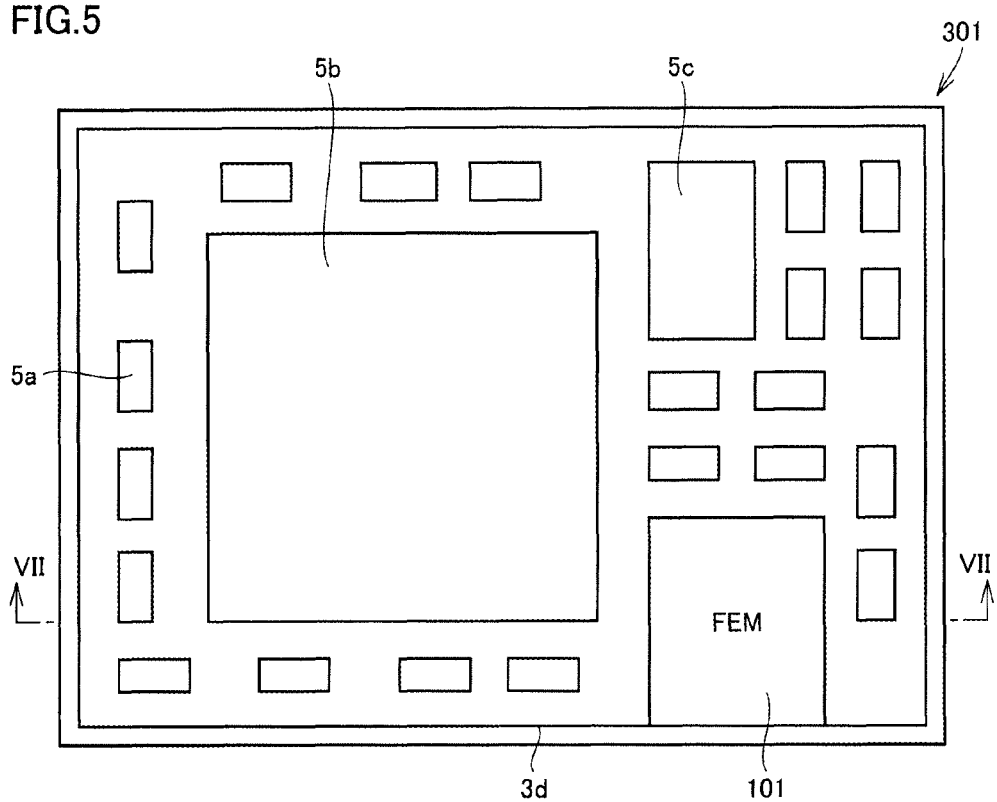
FIG. 5 is a perspective plan view of a circuit module according to the first embodiment based on the present disclosure.

FIG. 5 illustrates a perspective plan view of a circuit module 301 according to the present embodiment. Components and the like included in the circuit module 301 are covered by a sealing resin portion. For convenience sake of description, FIG. 5 illustrates the internal structure by seeing through the sealing resin portion. Inside the circuit module 301, a component 5a, a component 5b, and a component 5c as well as the first module 101 are disposed. The component 5b may be, for example, an IC. More specifically, the component 5b may be, for example, an IC having the function of a transceiver. The component 5c may be, for example, a quartz resonator. The first module 101 is disposed so as to be in contact with a side 3d of a sealing resin portion 3 of the circuit module 301. One side of the first module 101 is placed in the same plane as one side of the sealing resin portion 3.

Figure 6:
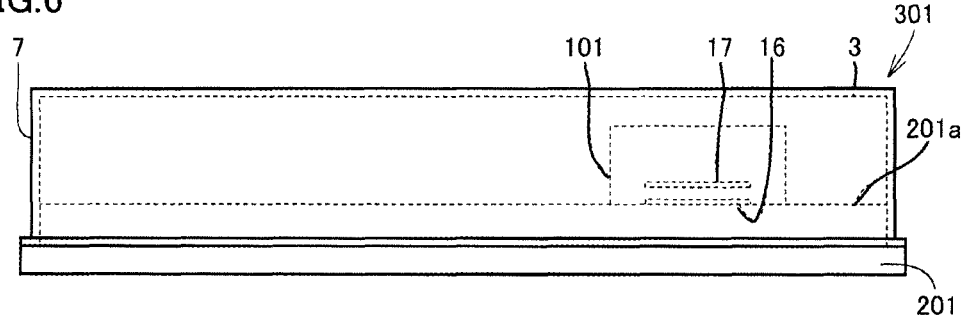
FIG. 6 is a side view of a circuit module according to the first embodiment based on the present disclosure.
Figure 7:
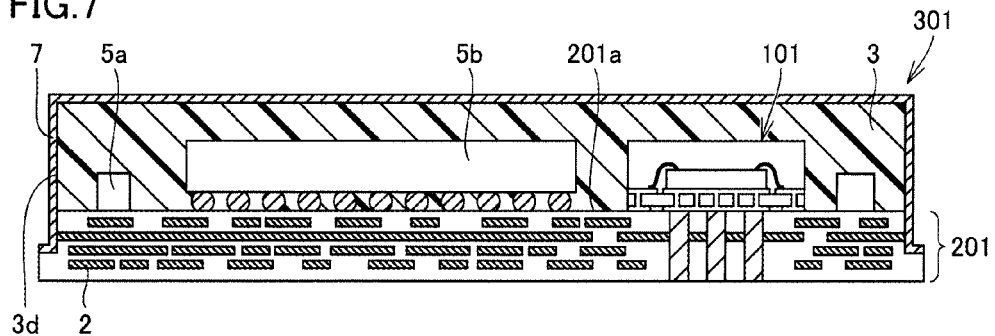
FIG. 7 is a section view along line VII-VII in FIG. 5.

FIG. 6 is a side view of the circuit module 301. The top surface and the sides of the sealing resin portion 3 are covered by a conductive material film 7. The conductive material film 7 is, for example, a film formed as a shield. The conductive material film 7 is, for example, a metal film. Cross sections of the conductor patterns 16 and 17 are positioned on the rear side, relative to the plane of the paper, of the conductive material film 7. The cross sections of the conductor patterns 16 and 17 are in contact with the backside of the conductive material film 7. The cross sections of the conductor patterns 16 and 17 are covered by the conductive material film 7 and are not viewed directly. Thus, the broken lines are used to indicate the cross sections of the conductor patterns 16 and 17 in FIG. 6. FIG. 7 indicates a section view along line VII-VII in FIG. 5.

The circuit module 301 according to the present embodiment includes a first substrate 201 having a first principal surface 201a, the first module 101 mounted on the first principal surface 201a, the sealing resin portion 3 formed on the first principal surface 201a and covering the first module 101, and the conductive material film 7 covering the side 3d of the sealing resin portion 3. The first module 101 includes the conductive material portion 10 and a device which may produce heat and which is mounted on the conductive material portion 10. A "device which may produce heat" encompasses, not only a device intended to produce heat, but also a device which produces heat unintentionally. Many of the devices producing heat in their operations correspond to such devices. A device which may produce heat is, for example the component 4a. The component 4a is, for example, a PA. The conductive material portion 10 is connected to the conductive material film 7 on the side 3d of the sealing resin portion 3.

In the present embodiment, the conductive material portion 10, which is a member on which a device which may produce heat is mounted in the first module 101, is connected to the conductive material film 7 on the side 3d of the sealing resin portion 3. Therefore, the heat produced by a device which may produce heat in the first module 101 is guided to the conductive material film 7 through the conductive material portion 10. Thus, the heat may be dissipated efficiently from the conductive material film 7. Therefore, in the circuit module 301, the heat produced from an embedded device which may produce heat may be dissipated efficiently.

Further, attention is to be focused on the position at which the first module 101 is mounted in the circuit module 301. The first module 101 is disposed so that the conductive material portion 10 of the first module 101 is connected to the conductive material film 7 on the side 3d of the sealing resin portion 3. This simply indicates that the first module 101 is disposed so as to be in contact with a side of the sealing resin portion 3. In other words, the arrangement in which the first module 101 is disposed in contact with a side of the sealing resin portion 3 indicates that a margin is unnecessary between the first module 101 and the side of the sealing resin portion 3. Thus, a so-called mounting margin for the first module 101 may be reduced, achieving the reduction in the size of the circuit module 301.

As illustrated in the present embodiment, it is preferable that the first module 101 include the insulated substrate 1, and that the conductive material portion 10 include the conductor pattern 17 disposed on the surface of the insulated substrate 1. Employment of this configuration enables the first module 101 to be manufactured by using a typical interposer at low cost. As illustrated in the present embodiment, a device, which has a structure including the insulated substrate 1, the conductor pattern 16, the conductor pattern 17, and the conductor vias 19, may easily be available as a typical interposer.

Figure 8:
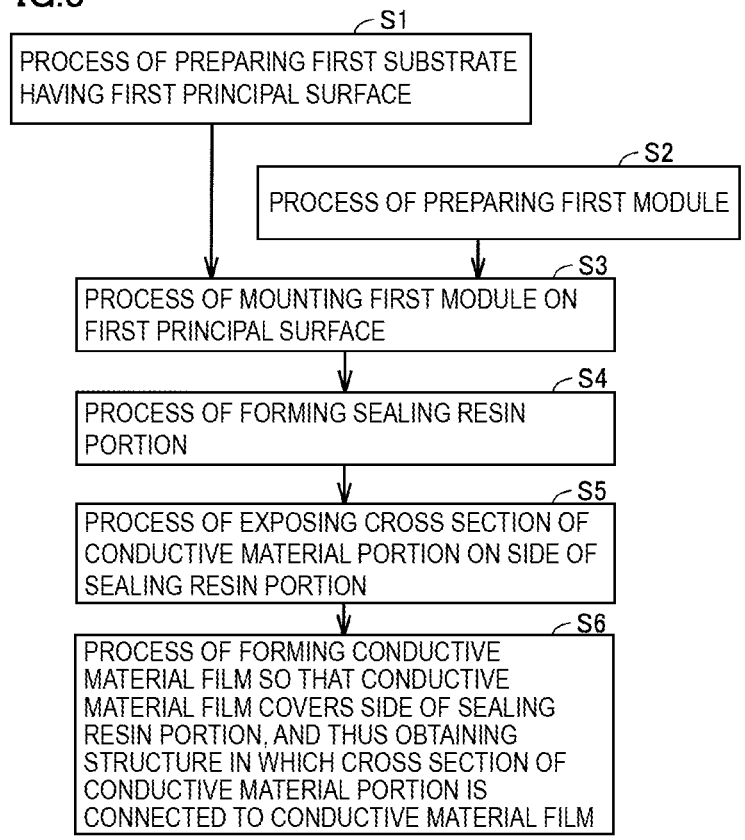
FIG. 8 is a flowchart of a method of manufacturing a circuit module according to the first embodiment based on the present disclosure.

Referring to FIGS. 8 to 16, a method of manufacturing a circuit module according to the first embodiment based on the present disclosure will be described. FIG. 8 illustrates a flowchart of the manufacturing method.

The method of manufacturing a circuit module according to the present embodiment includes the following processes: process S1 of preparing a first substrate including a first principal surface; process S2 of preparing a first module, the first module including a conductive material portion and a device which is capable of producing heat and which is mounted on the conductive material portion; process S3 of mounting the first module on the first principal surface; process S4 of forming a sealing resin portion on the first principal surface in such a manner that the sealing resin portion covers the first module; process S5 of exposing a cross section of the conductive material portion on a side of the sealing resin portion while a portion of the sealing resin portion is removed; and process S6 of forming a conductive material film in such a manner that the conductive material film covers the side of the sealing resin portion, and thus obtaining a structure having the exposed cross section of the conductive material portion connected to the conductive material film on the side of the sealing resin portion. Each process will be described in detail below.

Figure 9:
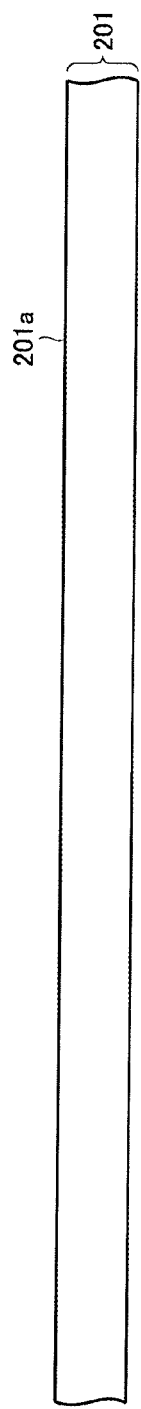
FIG. 9 is a diagram of describing the first process of a method of manufacturing a circuit module according to the first embodiment based on the present disclosure.

In process S1, as illustrated in FIG. 9, the first substrate 201 having the first principal surface 201a is prepared. A typical interposer may be used as the first substrate 201. In process S2, first modules 101 are prepared. The first modules 101 each have a configuration as described already in the present embodiment.

Figure 10:
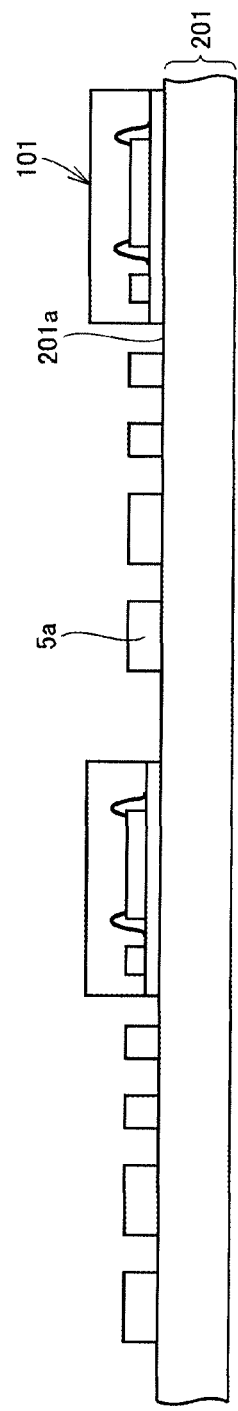
FIG. 10 is a diagram for describing the second process of a method of manufacturing a circuit module according to the first embodiment based on the present disclosure.

In process S3, as illustrated in FIG. 10, the first modules 101 are mounted on the first principal surface 201a of the first substrate 201. At that time, not only the first modules 101 but also other components may be mounted on the first principal surface 201a. In the example in FIG. 10, components 5a and the like are mounted on the first principal surface 201a.

Figure 11:
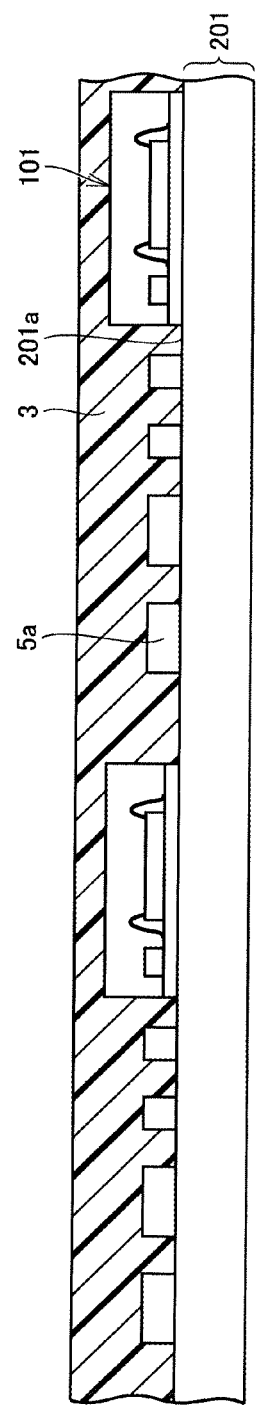
FIG. 11 is a diagram for describing the third process of a method of manufacturing a circuit module according to the first embodiment based on the present disclosure.
Figure 12:
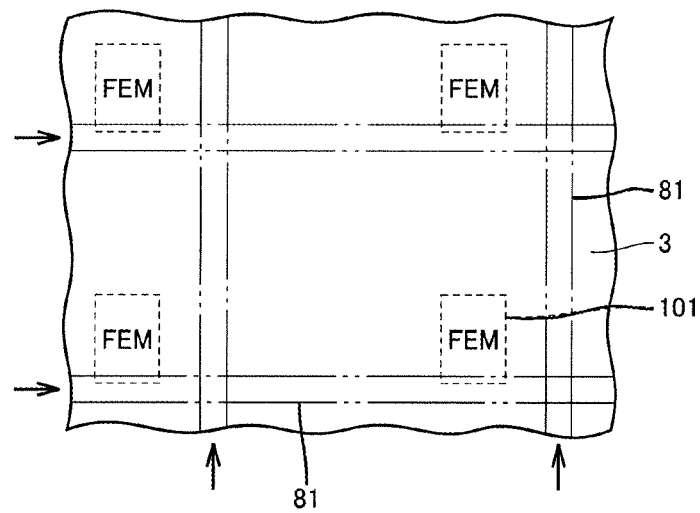
FIG. 12 is a first diagram for describing the fourth process of a method of manufacturing a circuit module according to the first embodiment based on the present disclosure.

In process S4, as illustrated in FIG. 11, the sealing resin portion 3 is formed on the first principal surface 201a so as to cover the first modules 101.

Figure 13:
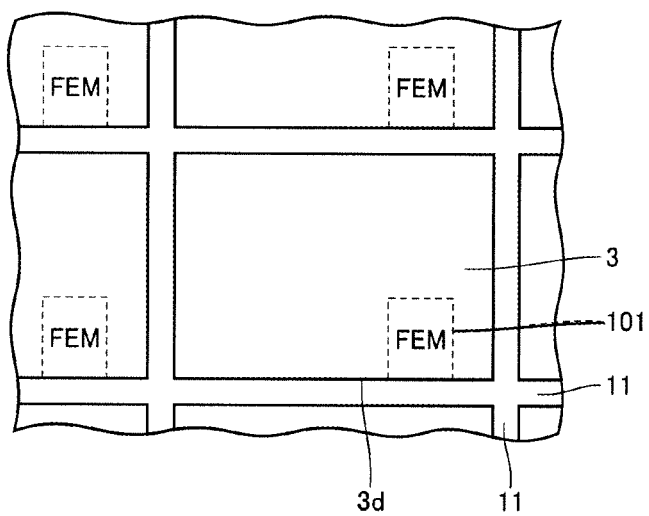
FIG. 13 is a second diagram for describing the fourth process of a method of manufacturing a circuit module according to the first embodiment based on the present disclosure.
Figure 14:
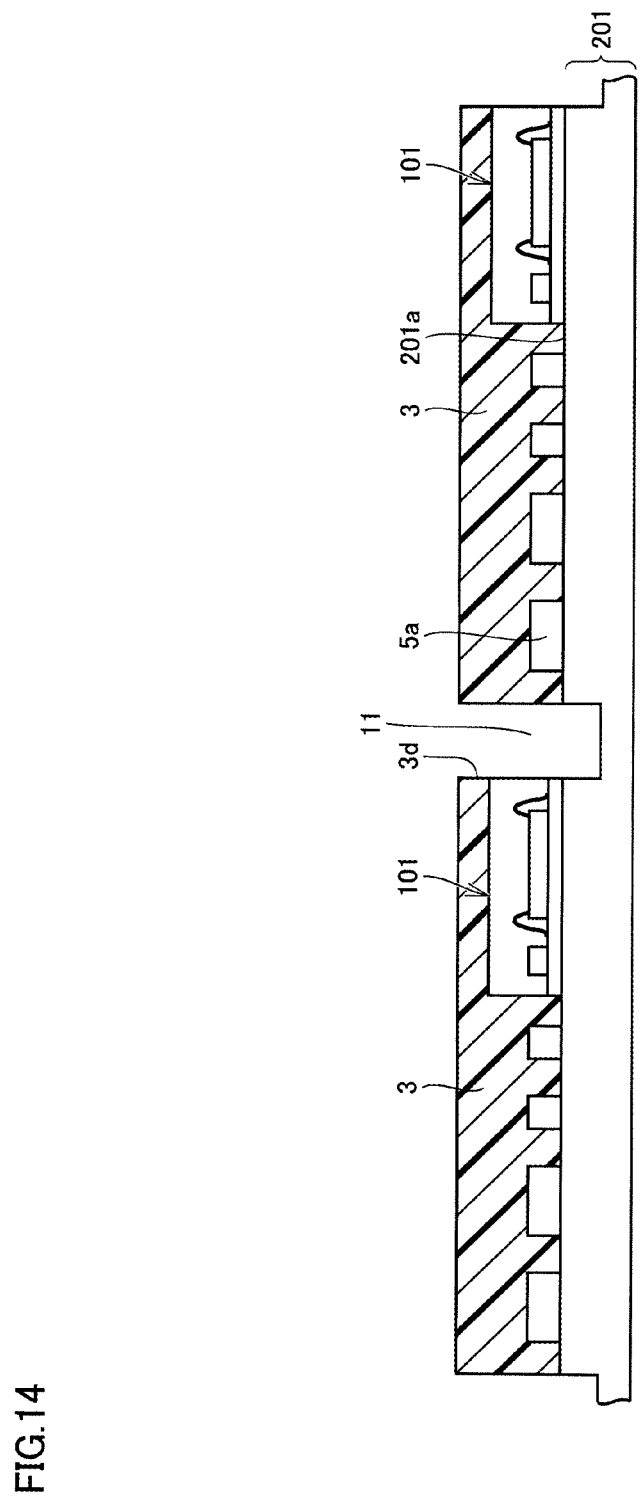
FIG. 14 is a third diagram for describing the fourth process of a method of manufacturing a circuit module according to the first embodiment based on the present disclosure.

In process S5, while portions of the sealing resin portion 3 are removed, the cross sections of the conductive material portions 10 are exposed on the side 3d of the sealing resin portion 3. Herein, an example in which so-called half cutting is performed will be described. The removal processing is performed by using a cutter as illustrated by the arrows along paths 81 illustrated in FIG. 12. The paths 81 are set so as to overlap slightly with the end portions of the first modules 101 covered by the sealing resin portion 3. In the removal processing, the large-size substrate is not completely cut, but just a grooving process is performed. As a result, grooves 11 are formed as illustrated in FIG. 13. After the formation of the grooves 11, the end portions of the first modules 101 have been already removed. FIG. 14 illustrates a section view of this state. The formation of the grooves 11 leads to the formation of the sides 3d of the sealing resin portions 3, and the end surfaces of the first modules 101 form portions of the sides 3d. The cross sections of the conductive material portions 10 of the first modules 101 are exposed on the sides 3d, which is not clear in FIG. 14. This process described so far is performed in process S5.

Figure 15:
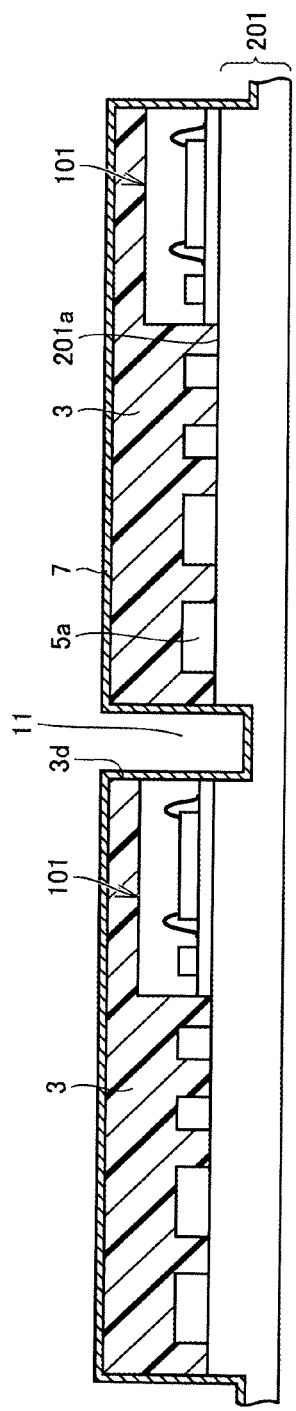
FIG. 15 is a diagram for describing the fifth process of a method of manufacturing a circuit module according to the first embodiment based on the present disclosure.

In process S6, as illustrated in FIG. 15, the conductive material film 7 is formed so as to cover the sides 3d of the sealing resin portions 3. Thus, a structure in which the exposed cross section of each conductive material portion 10 is connected to the conductive material film 7 on the side 3d of the corresponding sealing resin portion 3 is obtained.

Figure 16:
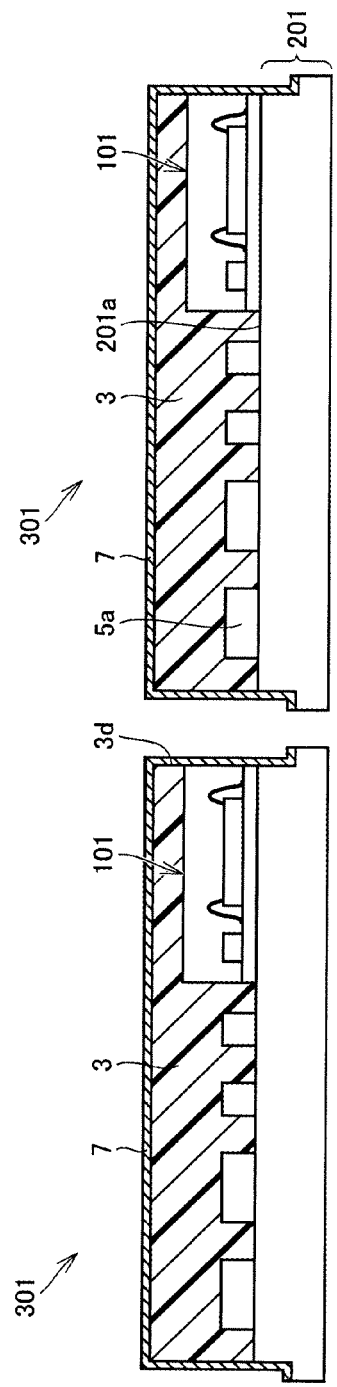
FIG. 16 is a diagram for describing the sixth process of a method of manufacturing a circuit module according to the first embodiment based on the present disclosure.
Figure 17:
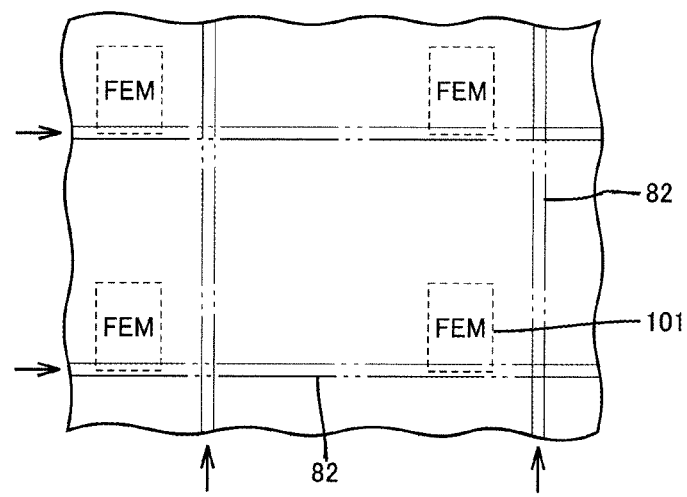
FIG. 17 is a first diagram for describing a modified example of a method of manufacturing a circuit module according to the first embodiment based on the present disclosure.

As illustrated in FIG. 16, the large-size substrate is divided into the individual unit size. Thus, individual circuit modules 301 are obtained. Multiple circuit modules 301 may be obtained from the large-size substrate.

As the method of manufacturing a circuit module according to the present embodiment, as illustrated herein, it is preferable that a first module include an insulated substrate, and that a conductive material portion include a conductor pattern disposed on the surface of the insulated substrate.

Employment of this method enables a first module using a typical interposer to be prepared at low cost in process S2.

Figure 18:
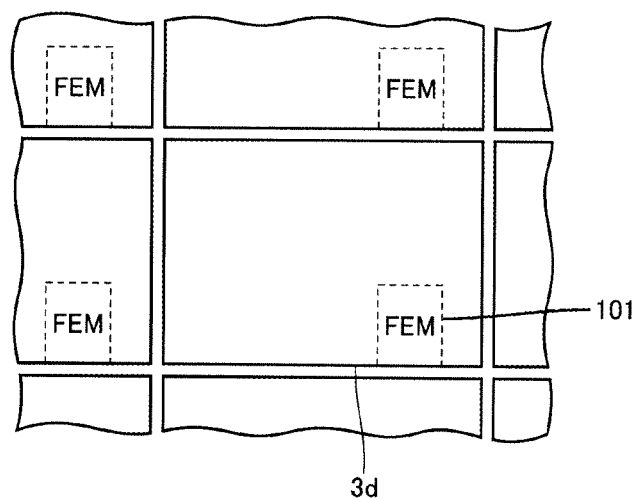
FIG. 18 is a second diagram for describing a modified example of a method of manufacturing a circuit module according to the first embodiment based on the present disclosure.
Figure 19:
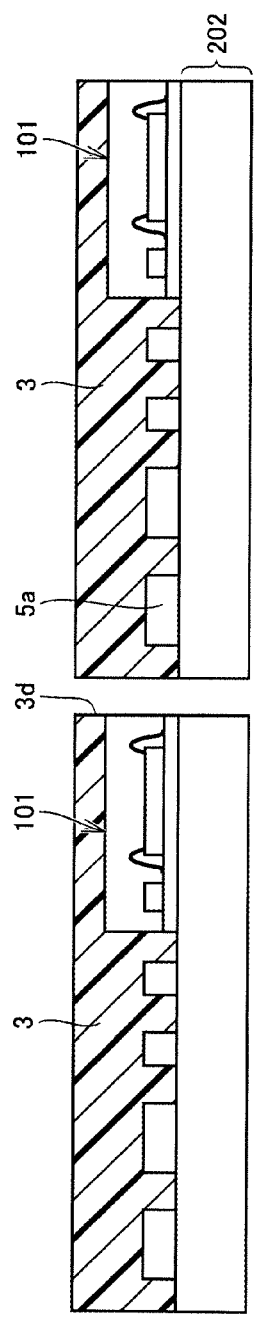
FIG. 19 is a third diagram for describing a modified example of a method of manufacturing a circuit module according to the first embodiment based on the present disclosure.
Figure 20:
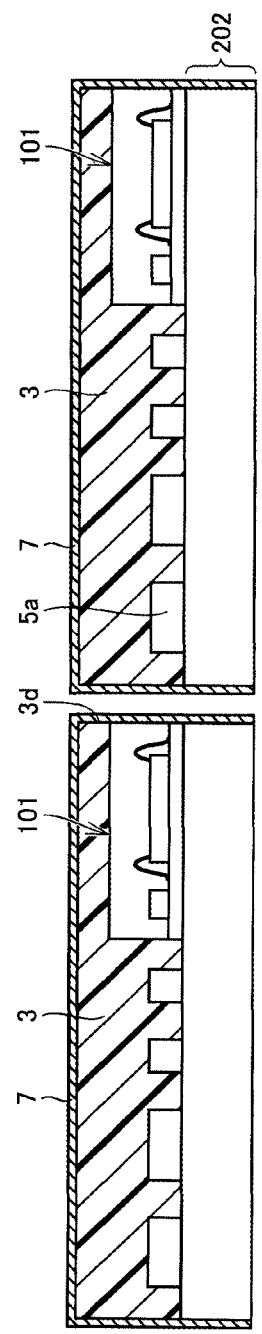
FIG. 20 is a fourth diagram for describing a modified example of a method of manufacturing a circuit module according to the first embodiment based on the present disclosure.

Referring to FIGS. 17 to 20, a modified example of the method of manufacturing a circuit module according to the present embodiment will be described. Processes S1 to S4 are the same as those already described. The example in which half cutting is performed in process S5 is described. In the modified example, an example in which so-called full cutting is performed will be described. Cutting processing is performed by using a cutter as illustrated by the arrows along paths 82 in FIG. 17. The paths 82 are set so as to overlap slightly with the end portions of the first modules 101 covered by the sealing resin portion 3. As a result, devices are obtained through cutting as illustrated in FIG. 18. FIG. 19 illustrates a section view of this state. In process S6, as illustrated in FIG. 20, the conductive material films 7 are formed so as to cover the sides 3*d* of the sealing resin portions 3. Thus, multiple circuit modules are obtained.

Second Embodiment

Figure 21:
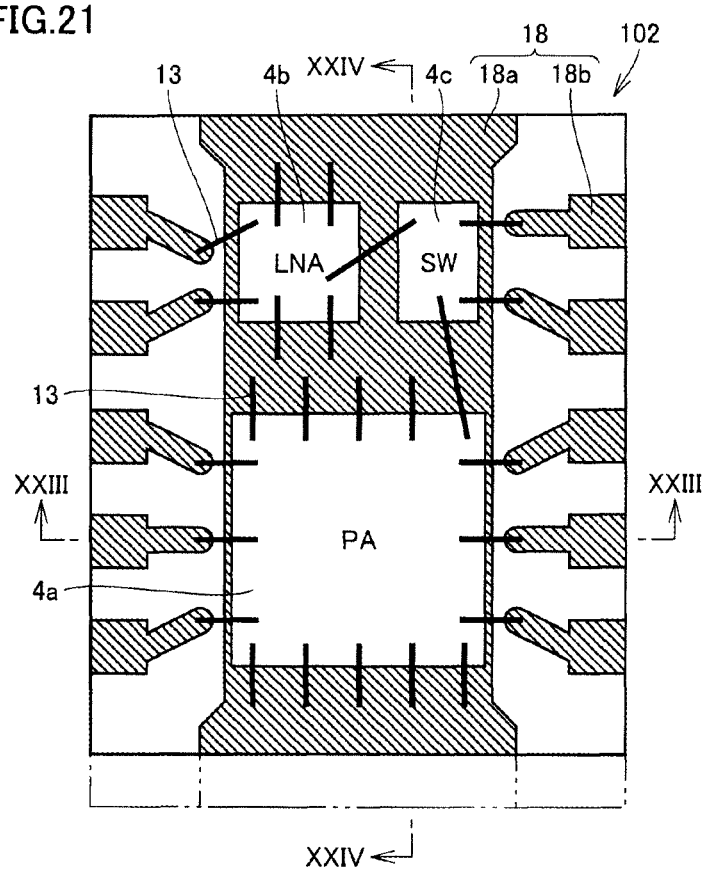
FIG. 21 is a perspective plan view of a first module included in a circuit module according to a second embodiment based on the present disclosure.

Referring to FIGS. 21 to 27, a circuit module according to a second embodiment based on the present disclosure will be described. Before a description about the entire circuit module according to the present embodiment, a first module 102 included in the circuit module will be described. FIG. 21 illustrates a perspective plan view of the first module 102. The first module 102 is, for example, a type of FEM. Components and the like included in the first module 102 are covered by a sealing resin portion. For convenience sake of description, FIG. 21 illustrates the internal structure by seeing through the sealing resin portion. The first module 102 includes a lead frame 18 as a conductive material portion. In the case where the lead frame 18 is formed of metal, the conductive material portion may be rephrased as a "metal portion". The lead frame 18 includes a first portion 18*a* and multiple second portions 18*b*. The component 4*a*, the component 4*b*, and the component 4*c* are disposed on the surface of the first portion 18*a*. The details of these components are similar to those described in the first embodiment. The second portions 18*b* are disposed along the outer sides. The second portions 18*b* serve as terminals. The configuration of the lead frame 18 described herein is merely an example for convenience sake of description, and is not limited to the configuration described above.

Figure 22:
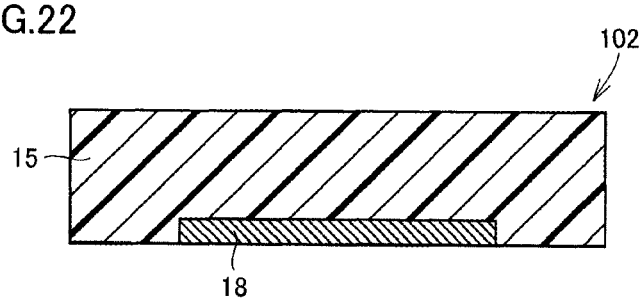
FIG. 22 is a side view of a first module included in a circuit module according to the second embodiment based on the present disclosure.
Figure 23:
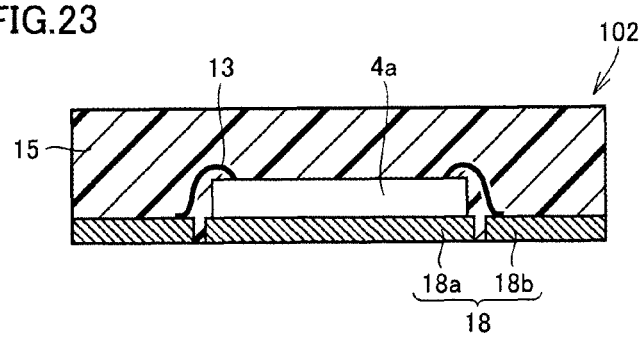
FIG. 23 is a section view along line XXIII-XXIII in FIG. 21.
Figure 24:
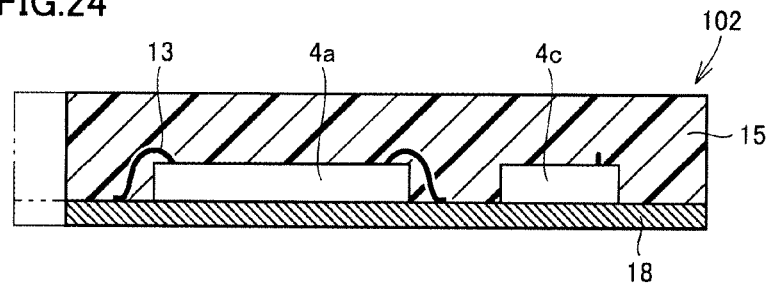
FIG. 24 is a section view along line XXIV-XXIV in FIG. 21.

FIG. 22 illustrates a side view of the first module 102. In FIG. 22, the lead frame 18 and the sealing resin portion 15 are shown. The component viewed in FIG. 22 is the first portion 18*a* of the lead frame 18. FIG. 23 illustrates a section view along line XXIII-XXIII in FIG. 21. FIG. 24 illustrates a section view along line XXIV-XXIV in FIG. 21. As illustrated in FIGS. 22 to 24, the first module 102 includes the lead frame 18 and the sealing resin portion 15. The lead frame 18 may be a frame formed by patterning a metal plate, for example, through blanking into a desired shape. The metal described herein may be, for example, copper. The lead frame 18 illustrated herein is entirely flat, but is not limited to this. The lead frame 18 may be a frame which is obtained by performing some deformation processing and in which a step is provided at any position in the lead frame 18. That is, the first portion 18*a* and a subset of the second portions 18*b* may not be placed on the same plane. Electrical connections are made by using the wires 13 between the terminals provided on the top surface of the component 4*a* and second portions 18*b*. In FIGS. 21 and 24, a portion of the end is illustrated by using the chain double-dashed lines. This portion is present at the first stage in which the first module 102 is manufactured by itself, but is removed when, after that, the first module 102 is mounted on some substrate and is finally formed as a circuit module. At the time point at which the first module 102 is finally formed as a circuit module, the portion illustrated by using the chain double-dashed lines in FIGS. 21 and 24 has been already removed. That is, the portion illustrated by using the solid lines in FIGS. 21 and 24 indicates the first module 102 that is present in a circuit module at the time point at which the first module 102 is finally formed as the circuit module.

Figure 25:
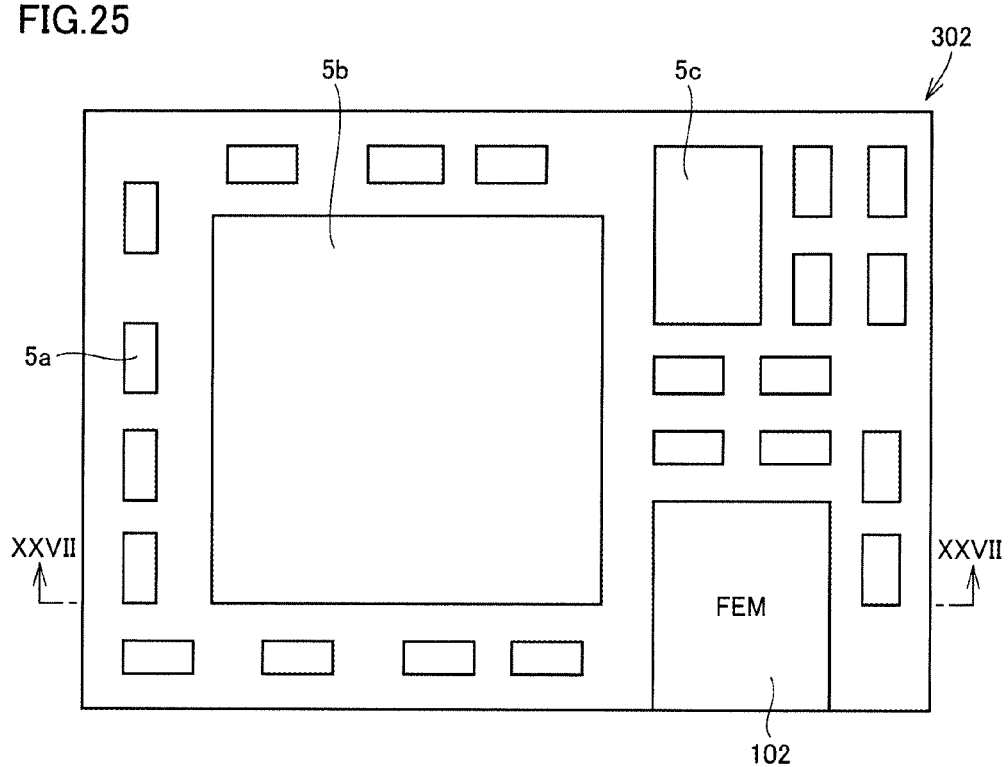
FIG. 25 is a perspective plan view of a circuit module according to the second embodiment based on the present disclosure.

FIG. 25 illustrates a perspective plan view of a circuit module 302 according to the present embodiment. Components and the like included in the circuit module 302 are covered by a sealing resin portion. For convenience sake of description, FIG. 25 illustrates the internal structure by seeing through the sealing resin portion. The component 5*a*, the component 5*b*, and the component 5*c* as well as the first module 102 are disposed inside the circuit module 302. The details of these components are similar to those described in the first embodiment. The first module 102 is disposed so as to be in contact with a side of the sealing resin portion 3 of the circuit module 302. One side of the first module 102 is placed in the same plane as one side of the sealing resin portion 3.

Figure 26:
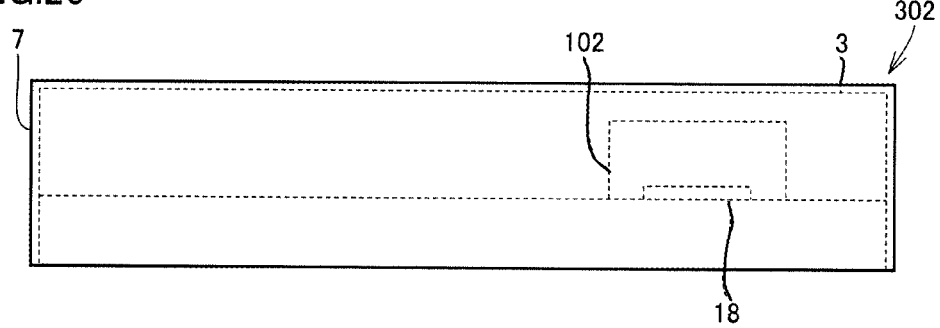
FIG. 26 is a side view of a circuit module according to the second embodiment based on the present disclosure.
Figure 27:
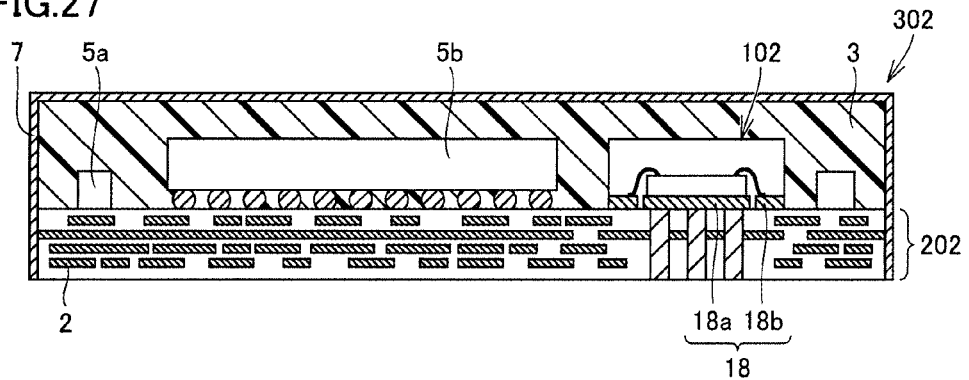
FIG. 27 is a section view along line XXVII-XXVII in FIG. 25.

FIG. 26 illustrates a side view of the circuit module 302. The top surface and the sides of the sealing resin portion 3 are covered by the conductive material film 7. The details of the conductive material film 7 are similar to those described in the first embodiment. A cross section of the lead frame 18 is positioned on the rear side, relative to the plane of the paper, of the conductive material film 7. The cross section of the lead frame 18 is in contact with the backside of the conductive material film 7. FIG. 27 illustrates a section view along line XXVII-XXVII in FIG. 25.

The circuit module 302 according to the present embodiment is common to the circuit module 301 described in the first embodiment, in terms of the basis configuration. In the circuit module 302, the conductive material portion includes the lead frame 18 as described above.

Also in the present embodiment, such an effect as described in the first embodiment may be obtained. In particular, in the present embodiment, a lead frame, which is a conductive material portion that is a member on which a device which may produce heat in the first module 102 is mounted, is connected to the conductive material film 7 on the side 3*d* of the sealing resin portion 3. Therefore, the heat produced by the device which may produce heat in the first module 102 is guided to the conductive material film 7 through the lead frame. Thus, the heat may be dissipated efficiently from the conductive material film 7. Typically, a lead frame is thick. Therefore, the area of a cross section of the lead frame is large. The present embodiment employs the structure in which the heat may be conducted to the conductive material film 7 through such a cross section of the lead frame. Therefore, the heat may be conducted to the conductive material film 7 efficiently, achieving efficient heat dissipation.

As described in the first embodiment, a margin is unnecessary between the first module 102 and the side of the sealing resin portion 3 Thus, a so-called mounting margin of the first module 102 may be reduced, achieving the reduction in the size of the circuit module 302.

In the present embodiment, by using a typical lead frame, the first module 102 may be manufactured at low cost. The lead frame 18 as described in the present embodiment may easily be available by using a typical lead frame technique.

A method of manufacturing a circuit module according to the second embodiment based on the present embodiment will be described. The manufacturing method is similar to the manufacturing method described in the first embodiment basically. However, the following point is different.

In the method of manufacturing a circuit module according to the present embodiment, the conductive material portion is a lead frame. Employment of this method enables a first module using a typical lead frame to be prepared at low cost in process S2 (see FIG. 8).

Third Embodiment

Figure 28:
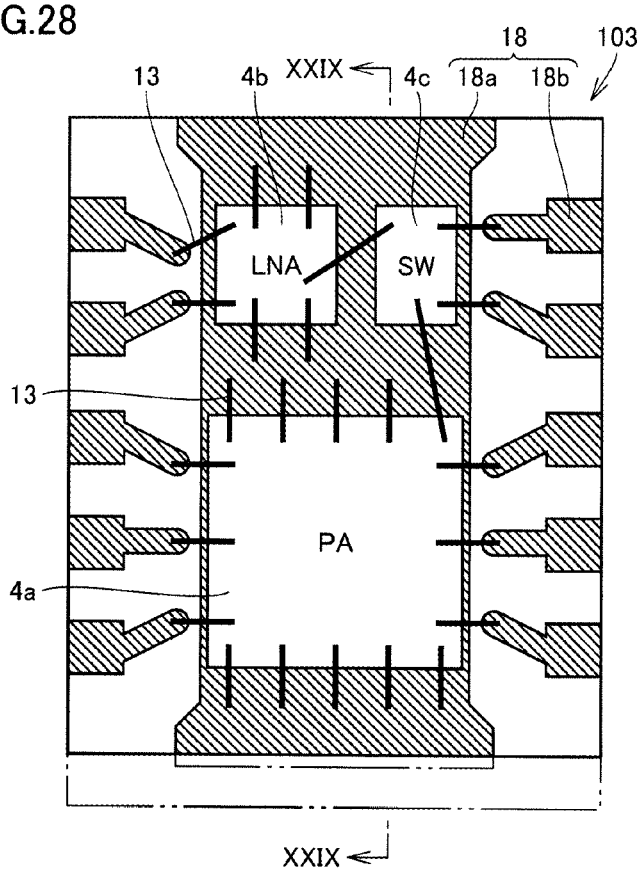
FIG. 28 is a perspective plan view of a circuit module according to a third embodiment based on the present disclosure.
Figure 29:
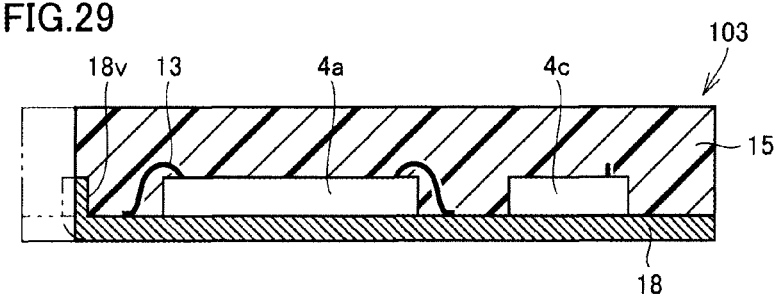
FIG. 29 is a section view along line XXIX-XXIX in FIG. 28.
Figure 30:
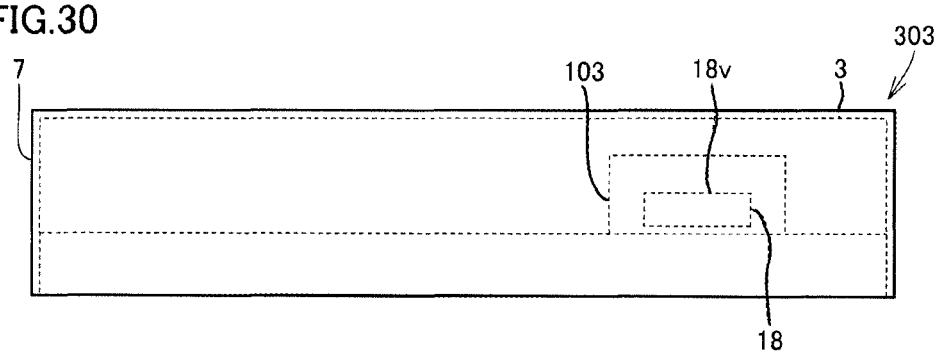
FIG. 30 is a side view of a circuit module according to the third embodiment based on the present disclosure.

Referring to FIGS. 28 to 30, a circuit module according to a third embodiment based on the present disclosure will be described. Before a description about the entire circuit module according to the present embodiment, a first module 103 included in the circuit module will be described. FIG. 28 illustrates a perspective plan view of the first module 103. The first module 103 is, for example, a type of FEM. Components and the like included in the first module 103 are covered by a sealing resin portion. For convenience sake of description, FIG. 28 illustrates the internal structure by seeing through the sealing resin portion. The first module 103 includes the lead frame 18 as a conductive material portion. The details of the lead frame 18 are similar to those described in the second embodiment. The component 4a, the component 4b, and the component 4c are disposed on the surface of the first portion 18a. The details of these components are similar to those described in the first embodiment. FIG. 29 illustrates a section view along line XXIX-XXIX in FIG. 28. As illustrated in FIG. 29, a bent portion 18v is provided at least at one end of the lead frame 18. In FIGS. 28 and 29, a portion of the end is illustrated by using the chain double-dashed lines. This portion is present at the first stage in which the first module 103 is manufactured by itself, but is removed when, after that, the first module 103 is mounted on some substrate and is finally formed as a circuit module. At the time point at which the first module 103 is finally formed as a circuit module, the portion illustrated by using the chain double-dashed lines in FIGS. 28 and 29 has been already removed. That is, the portion illustrated by using the solid lines in FIGS. 28 and 29 indicates the first module 103 that is present in the circuit module at the time point at which the first module 103 is finally formed as the circuit module. A portion of the bent portion 18v has been also removed. The portion of the bent portion 18v has been removed so that the thickness of the bent portion 18v is reduced in the state in which the bent portion 18v bends upwards and vertically. Therefore, compared with the case in which an end of the lead frame 18 is not bent and is simply cut off at some position, the area of the cross section of the lead frame 18, which is exposed on the side that is newly generated after the removal processing, is large.

FIG. 30 illustrates a side view of a circuit module 303. The point that the top surface and the sides of the sealing resin portion 3 are covered by the conductive material film 7 is similar to that described in the first embodiment. The details of the conductive material film 7 are similar to those described in the first embodiment. The cross section of the lead frame 18 is positioned on the rear side, relative to the plane of the paper, of the conductive material film 7. The cross section of the lead frame 18 is in contact with the backside of the conductive material film 7. However, unlike the second embodiment, a large cross section of the bent portion 18v of the lead frame 18 is present in this position, and is connected to the conductive material film 7. Therefore, the area of the cross section of the lead frame 18, which is illustrated by using the broken lines in FIG. 30, is large.

In the present embodiment, the lead frame 18 serving as the conductive material portion includes the bent portion 18v extending along a side of the sealing resin portion 3, and the bent portion 18v is connected to the conductive material film 7.

Also in the present embodiment, such an effect as described in the first embodiment may be obtained. In particular, in the present embodiment, the conductive material portion includes the lead frame 18, and the bent portion 18v of the lead frame 18 serving as the conductive material portion is further connected to the conductive material film 7. Therefore, a connection with the conductive material film may be made with a large cross-sectional area whose size exceeds the thickness of the lead frame, achieving efficient heat dissipation.

Some exemplary circuit modules are described in the embodiments described above. Such a circuit module is not limited to the examples described in the embodiments, and may further include a member for dissipating heat, in such a manner that the member is connected to the conductive material film 7. A "member for dissipating heat" may be, for example, a heat sink.

Some of the embodiments described above may be appropriately combined together for employment.

The embodiments disclosed herein and described above are exemplary in all respects, and are not limiting. The scope of the present disclosure is indicated by the scope of claims, and encompasses all changes in the meaning and the scope of equivalents to the scope of claims.

1 insulated substrate
2 conductor pattern (inside first substrate)
3, 15 sealing resin portion
3d side
4a, 4b, 4c, 5a, 5b component
7 conductive material film
10 conductive material portion
11 groove
13 wire
12, 16, 17 conductor pattern (disposed on surface of insulated substrate)
18 lead frame
18a first portion (of lead frame)
18b second portion (of lead frame)
18v bent portion
19 conductor via
81, 82 path
101, 102, 103 first module
201, 202 first substrate
201a first principal surface
301, 302, 303 circuit module

The invention claimed is:

1. A circuit module comprising:
a first substrate having a first principal surface;
a first module mounted over the first principal surface, the first module comprising a device generating heat;
a sealing resin portion provided on the first principal surface and covering the first module;
a conductive material film covering a side of the sealing resin portion, and
a conductive material portion disposed at least partially between the first principal surface and the first module, wherein the conductive material portion is thermally coupled to the device and extends through the sealing resin portion to be connected to the conductive material film on the side of the sealing resin portion.

2. The circuit module according to claim 1,
wherein the first module has an insulated substrate, and
wherein the conductive material portion includes a conductor pattern disposed on a surface of the insulated substrate.

3. The circuit module according to claim 1,
wherein the conductive material portion includes a lead frame.

4. The circuit module according to claim 3,
wherein the conductive material portion includes a bent portion extending along the side of the sealing resin portion, and
wherein the bent portion is connected to the conductive material film.

5. A method for manufacturing a circuit module, comprising:
a step of preparing a first substrate including a first principal surface;
a step of preparing a first module, the first module including a conductive material portion, and a device capable of producing heat and mounted on the conductive material portion;
a step of mounting the first module on the first principal surface;
a step of forming a sealing resin portion on the first principal surface in such a manner that the sealing resin portion covers the first module;
a step of exposing a cross section of the conductive material portion on a side of the sealing resin portion while a portion of the sealing resin portion is removed; and
a step of forming a conductive material film in such a manner that the conductive material film covers the side of the sealing resin portion, and thus obtaining a structure having the exposed cross section of the conductive material portion connected to the conductive material film on the side of the sealing resin portion.

6. The method for manufacturing a circuit module, according to claim 5,
wherein the first module has an insulated substrate, and
wherein the conductive material portion includes a conductor pattern disposed on a surface of the insulated substrate.

7. The method for manufacturing a circuit module, according to claim 5,
wherein the conductive material portion includes a lead frame.

* * * * *